United States Patent
Kim et al.

(10) Patent No.: US 9,373,406 B2
(45) Date of Patent: Jun. 21, 2016

(54) FLASH MEMORY BASED ON STORAGE DEVICES AND METHODS OF OPERATION

(71) Applicants: Youngwook Kim, Hwasung (KR); Hwaseok Oh, Yongin-si (KR); Soonbok Jang, Seoul (KR); Ji-Seung Youn, Seoul (KR)

(72) Inventors: Youngwook Kim, Hwasung (KR); Hwaseok Oh, Yongin-si (KR); Soonbok Jang, Seoul (KR); Ji-Seung Youn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/299,464

(22) Filed: Jun. 9, 2014

(65) Prior Publication Data
US 2015/0098275 A1 Apr. 9, 2015

(30) Foreign Application Priority Data
Oct. 4, 2013 (KR) .................. 10-2013-0118816

(51) Int. Cl.
| G11C 7/00 | (2006.01) |
| G11C 16/26 | (2006.01) |
| G11C 7/10 | (2006.01) |
| G11C 7/22 | (2006.01) |
| G11C 16/32 | (2006.01) |
| G06F 13/16 | (2006.01) |

(52) U.S. Cl.
CPC ............ *G11C 16/26* (2013.01); *G06F 13/1689* (2013.01); *G11C 7/1057* (2013.01); *G11C 7/1066* (2013.01); *G11C 7/222* (2013.01); *G11C 16/32* (2013.01)

(58) Field of Classification Search
USPC ........................................... 365/193
See application file for complete search history.

(56) References Cited

U.S. PATENT DOCUMENTS

| 6,680,869 B2 | 1/2004 | Sonoda et al. |
| 6,785,189 B2 | 8/2004 | Jacobs et al. |
| 7,266,022 B2 | 9/2007 | Aoki |
| 7,715,253 B2 | 5/2010 | Kim et al. |
| 8,151,133 B2 | 4/2012 | Kizer et al. |
| 8,199,546 B2 | 6/2012 | Koshizuka |
| 8,422,319 B2 | 4/2013 | Sriadibhatla et al. |
| 8,427,892 B2 | 4/2013 | Venkataraman et al. |
| 2011/0264851 A1* | 10/2011 | Jeon .................... G06F 13/1689 711/103 |
| 2012/0163101 A1 | 6/2012 | Kato |
| 2013/0265826 A1* | 10/2013 | Lee .......................... G11C 16/10 365/185.17 |
| 2014/0016404 A1* | 1/2014 | Kim ...................... G11C 11/165 365/158 |

FOREIGN PATENT DOCUMENTS

KR 1020070054017 A 5/2007

* cited by examiner

*Primary Examiner* — Hoai V Ho
(74) *Attorney, Agent, or Firm* — Volentine & Whitt, PLLC

(57) ABSTRACT

A method transfers read data from a flash memory to a controller synchronously with respect to a data strobe signal during a read data transfer period. During an initial control period of the read data transfer period, the cycle of the data strobe signal is expanded such that a pulse width of the resulting cycle-controlled data strobe signal is greater than a pulse width of the data strobe signal.

10 Claims, 16 Drawing Sheets

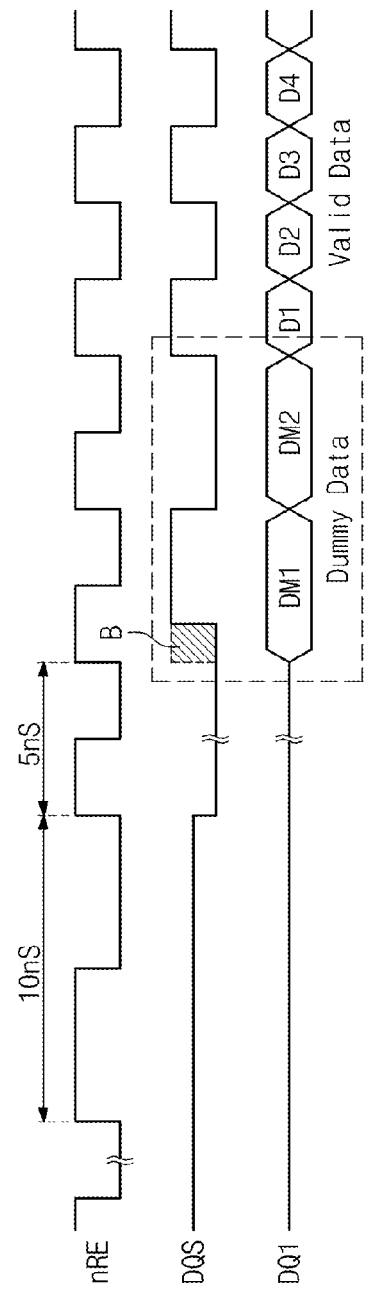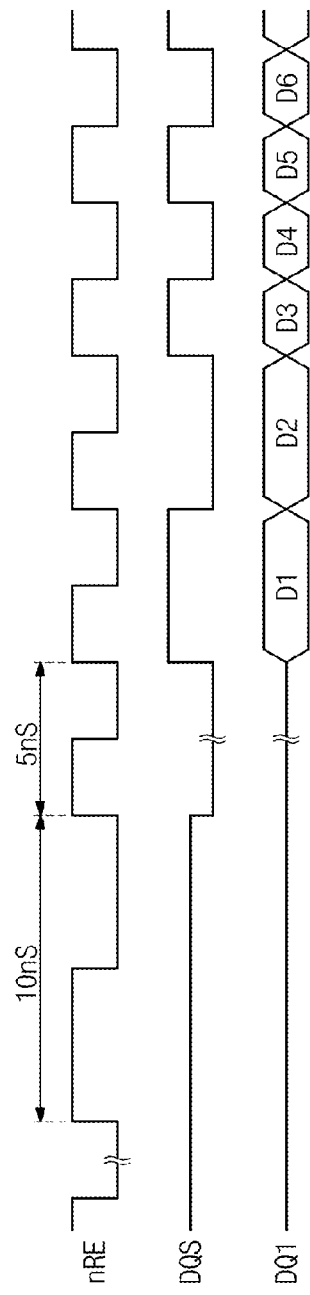

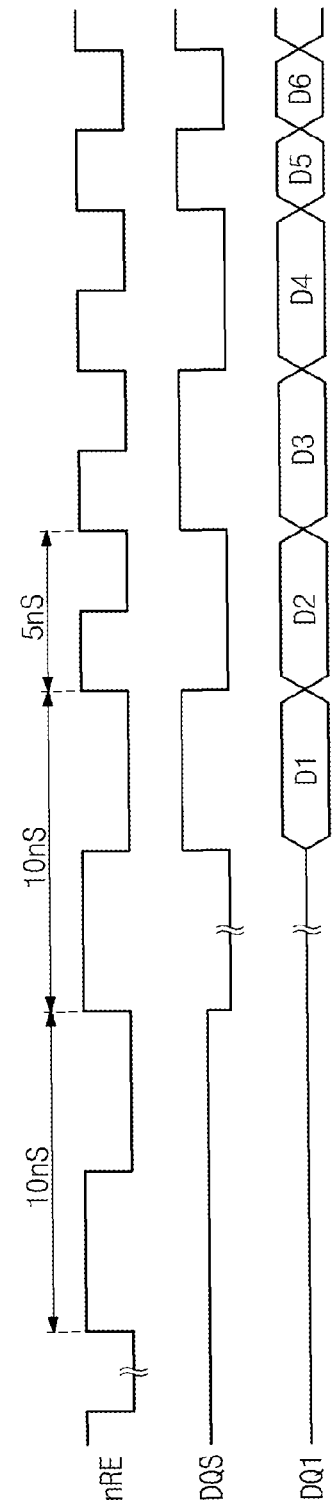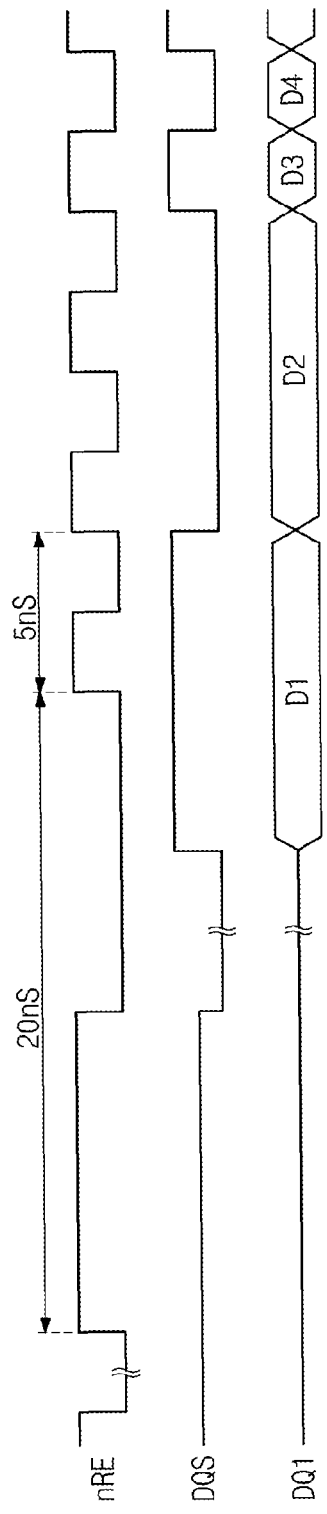

FLASH MEMORY BASED ON STORAGE DEVICES AND METHODS OF OPERATION

CROSS-REFERENCE TO RELATED APPLICATIONS

A claim for priority under 35 U.S.C. §119 is made to Korean Patent Application No. 10-2013-0118816 filed Oct. 4, 2013, the subject matter of which is hereby incorporated by reference.

BACKGROUND

The inventive concept relates generally to semiconductor memory devices and methods of operation. More particularly, the inventive concept relates to flash memory based storage devices and related methods of operation.

Flash memory based data storage devices (e.g., solid state drives or SSD) are increasingly being used as replacement components for hard disk drives (HDD). Flash memory based data storage devices may include one or more memory cards, such as a secure data (SD) card and/or a multimedia card (MMC).

Flash memory based data storage devices usually include a memory controller that controls the operation of flash memory, however it is specifically configured. Data is exchanged between the flash memory and memory controller at relatively high speeds. This rapid transfer of data is often facilitated by the coincident exchange of one or more control signals. These control signals are variously intended to ensure the accuracy of data transfer between the flash memory and corresponding memory controller. Unfortunately, with higher and higher data transfer speeds, smaller memory system designs, and increasingly stressful operating environments, the exchange of control signals is becoming a problem. Hence, flash based storage devices must ensure that control signals are appropriately communicated and received, since the successful transfer of data within a memory system is quite often highly contingent upon the accuracy of the control signals.

SUMMARY

In one embodiment, the inventive concept provides a storage device comprising; a memory controller connected via a data strobe line and a plurality of data lines to a flash memory and comprising a read enable signal (nRE) cycle control circuit, the flash memory being configured during a read operation to provide read data to the memory controller and comprising a data strobe generator, wherein during the read operation, the nRE cycle control circuit provides a cycle-controlled read enable signal to the flash memory during an initial control period, the flash memory, upon receiving the cycle-controlled read enable signal, uses the data strobe generator to generate a cycle-controlled data strobe signal having a cycle that correspond to a cycle of the cycle-controlled read enable signal and provides the cycle-controlled data strobe signal to the memory controller, such that the read data is transferred from the flash memory to the memory controller synchronously with the cycle-controlled data strobe signal.

In another embodiment, the inventive concept provides a method of operation for a storage device including a flash memory and a memory controller connected to the flash memory via a data strobe line and a plurality of data lines, the method comprising; controlling a cycle of a data strobe signal to generate a cycle-controlled data strobe signal that is exchanged between the flash memory and memory controller, and transferring data via the plurality of data lines between the flash memory and memory control synchronously with respect to the cycle-controlled data strobe signal.

In another embodiment, the inventive concept provides a method of operation for a storage device including a flash memory and a memory controller connected to the flash memory via a data strobe line and a plurality of data lines, the method comprising; transferring read data from the flash memory to the memory controller during a read operation, wherein the read data is synchronously transferred with respect to a data strobe signal from the flash memory to the memory controller via the plurality of data lines during a read data transfer period, and the data strobe signal is communicated from the flash memory to the memory controller via the data strobe line, and during an initial control period of the read data transfer period, expanding the cycle of the data strobe signal to generate a cycle-controlled data strobe signal communicated via the data strobe signal line, such that a pulse width of the cycle-controlled data strobe signal is at least twice that of a pulse width of the data strobe signal.

BRIEF DESCRIPTION OF THE DRAWINGS

The above and other objects and features will become apparent from the following description with reference to the following figures, wherein like reference numerals refer to like parts throughout the various figures unless otherwise specified, and wherein

FIG. 6 is a timing diagram illustrating in one example a method of controlling the cycle for a data strobe signal DQS used in the storage device of FIG. 1;

FIGS. 7, 8 and 9 are respective timing diagrams illustrating operations in which a dummy DQS signal and dummy data are not used according to certain embodiments of the inventive concept;

DETAILED DESCRIPTION

Figure 1:
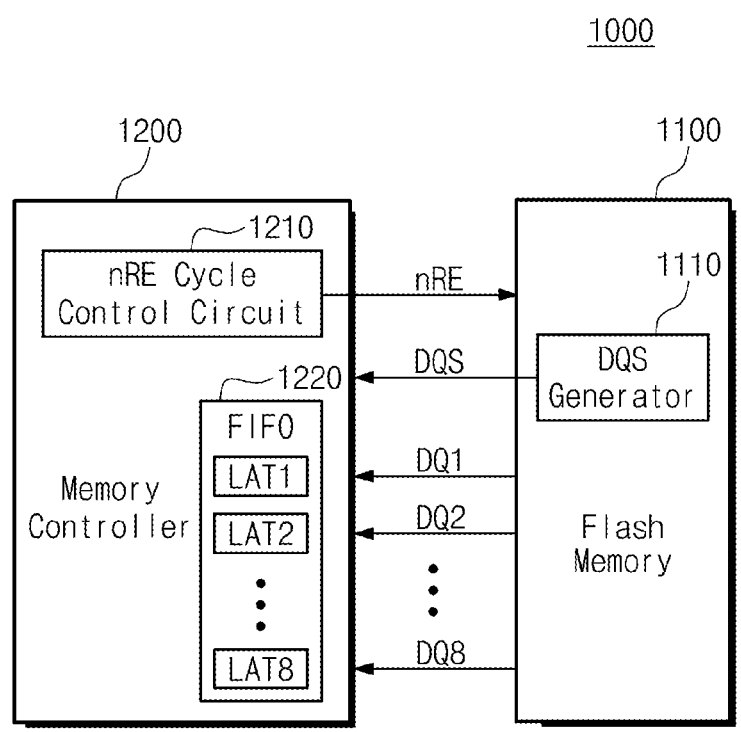
FIG. 1 is a block diagram illustrating a storage device according to an embodiment of the inventive concept.

Embodiments of the inventive concept will now be described in some additional detail with reference to the accompanying drawings. However, the inventive concept may be variously embodied in different forms and should not be construed as being limited to only the illustrated embodiments. Rather, these embodiments are provided as examples so that this disclosure will be thorough and complete, and will fully convey the concept of the inventive concept to those skilled in the art. Unless otherwise noted, like reference numbers and labels denote like or similar elements throughout the drawings and written description.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure (FIG. 1 is a block diagram illustrating a storage device according to an embodiment of the inventive concept. Referring to FIG. 1, a storage device 1000 comprises a flash memory 1100 and a memory controller 1200.

Flash memory based data storage devices, like the one illustrated in FIG. 1, may include a solid state drive (SSD) functioning as a replacement for a hard disk drive (HDD). Flash memory based data storage devices may alternately or additionally include one or more memory cards, such as a secure data (SD) card, a multi-media card (MMC), and the like. Using contemporary manufacturing and fabrication techniques, it is possible to provide very small semiconductor memory devices, such as the eSSD, eMMC, and Universal Flash Storage (UFS) to name but a specific few. Indeed, such very small semiconductor memory devices may be physically and functionally embedded within a myriad of contemporary, portable electronic devices. For example, an eSSD may be incorporated within a laptop computer, a tablet PC, or an e-book. An eMMC may be incorporated within for a mobile device.

Referring to FIG. 1, the memory controller 1200 is connected to the flash memory 1100 via a number of signal lines. Respective signal lines may be used for a single dedicated use, or may be variously used to communicate a number of different signal types. FIG. 1 specifically illustrates as examples a data strobe line capable of providing a data strobe signal (DQS) from the flash memory 1100 to the memory controller 1200, and a plurality of data lines, each respectively capable of communicating a corresponding data signal from the flash memory 1100 to the memory controller 1200.

It is assumed that the memory controller 1200 receives various read request(s) from time to time from an external device. In response to each read request, the memory controller 1200 provides a read enable signal nRE to the flash memory 1100 via an appropriate signal line. A DQS generator 1110 provided within the flash memory 1100 may be used to generate a corresponding data strobe signal in response to the read enable signal. As shown in FIG. 1, the flash memory 1100 provides the data strobe signal to the memory controller 1200 via the data strobe line.

Further in response to a read request, the memory controller 1200 receives "read data" designated by the read request from the flash memory 1100 via the plurality of data lines and in conjunction with the data strobe signal. Hence, data output signals (e.g., DQ1 to DQ8) may be synchronous with (e.g., communicated in alignment with a rising edge or a falling edge of) the data strobe signal. FIG. 1 assumes an embodiment in which 8-bit data is output in relation to corresponding transitions (high-to-low and/or low-to-high changes) in the data strobe signal. In this manner, output read data may be sequentially stored in respective latch circuits LAT1 to LAT8 of a first-in/first-output (FIFO) circuit 1220 disposed in the memory controller 1200.

Figure 2:
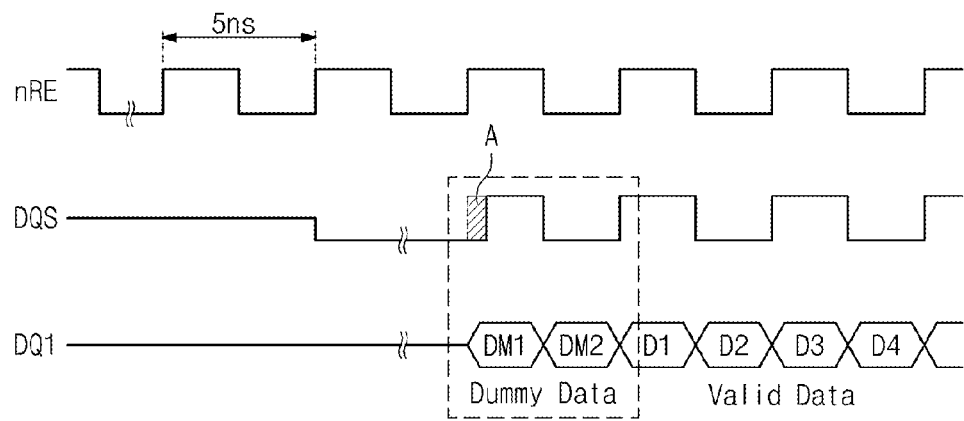
FIGS. 2 and 3 are respective timing diagrams illustrating the execution of a read operation by the storage device of FIG. 1.
Figure 3:
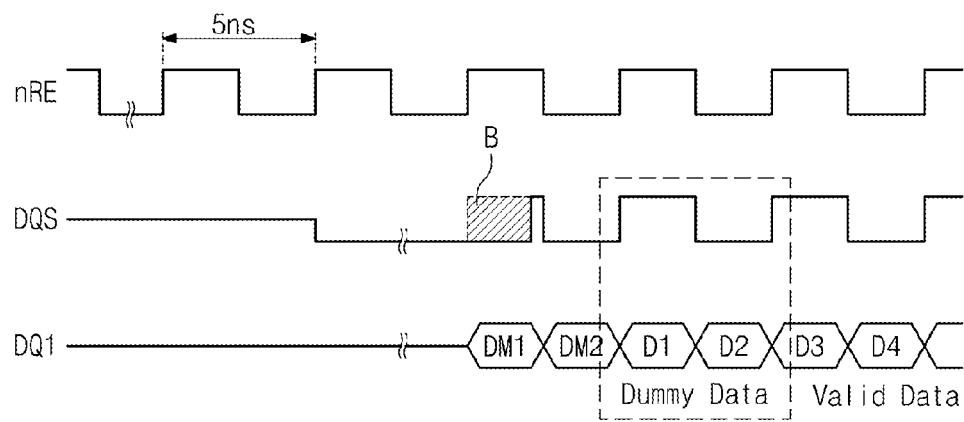

FIGS. 2 and 3 are respective timing diagrams illustrating possible variations in the execution of a read operation by the storage device 1000 of FIG. 1. Consistent with the assumptions described in relation to the storage device of FIG. 1, FIGS. 2 and 3 assume that first and second dummy read data bits are initially provided followed by a sequence of eight (8) read data bits (D1 to D8) that are sequentially and synchronously provided in relation to transitions of the data strobe signal.

Referring to FIGS. 1 and 2, a read enable signal nRE is provided by the flash memory 1100 and is assumed to have a 5 ns cycle. Then, after about a 10 ns delay from the read enable signal, the data strobe signal is provided from the flash memory 1100 to the memory controller 1200. Ideally in the illustrated example of FIG. 2, each cycle of the data strobe signal DQS should be equal to and synchronous with a corresponding cycle of the read enable signal nRE. However, certain resistive effects associated with the data strobe signal line may attenuate the width of a first "high" pulse (i.e., a first half cycle in which the data strobe signal goes logically high).

As a result, the first high pulse width for the data strobe signal may become narrowed by (e.g.,) the cross-hatched period 'A' shown in FIG. 2. Since this phenomenon (i.e., an un-tuned first duty rate for the data strobes signal DQS) is understood to happen under certain conditions, the flash memory 1100 is configured to communicate at least one "dummy read data" bit at the front end of a read data transmission period. In this manner, a valid data strobe signal may be ensured during the actual transmission of the following read data. In the example of FIG. 2, the memory controller 1200 will ignore first and second dummy data bits (e.g., DM1 and DM2) that correspond to a first (or dummy) pulse of the data strobe signal. Thereafter, the memory controller 1200 will sequentially latch read data bits D1 to D4 that correspond to the next eight (8) transitions of the data strobe signal DQS using the first latch circuit LAT1 of the FIFO circuit 1220.

FIG. 3 illustrates a case wherein the pulse attenuation of the first high pulse of the data strobe signal DQS is significantly more pronounced. (See, cross-hatched period 'B' of FIG. 3). Such an occurrence may be the result of a fabrication or layout error that results in a marginally defective data strobe signal line. Here, the first high pulse width is so narrow that it causes an abnormal case wherein the arrival of the first pulse of the data strobe signal is interpretatively "missed" by the memory controller 1200.

In such abnormal cases, the memory controller 1200 will not recognize the first (or dummy) pulse of the data strobe signal thereby missing the first and second dummy read data bits (DM1 and DM2), and will instead interpret the first valid pulse of the data strobe signal as the dummy pulse of the data strobe signal, and recognizing the first and second valid read data bits (D1 and D2) as dummy read data bits. This is a real problem, as under these conditions, the memory controller 1200 will discard the first and second valid read data bits (D1 and D2) and begin latching the provided read data only upon receiving the second and third valid read data bits (D3 and D4) in the FIFO circuit 1220.

However, the storage device 1000 of FIG. 1 according to certain embodiments of the inventive concept is able to effectively control the width of a first pulse of a data strobe signal provided to the memory controller 1200 via a data strobe line, such that the foregoing misinterpretation and loss of read data bits does not occur, despite the possibility that the data strobe signal line is less than optimal in its signal transfer capabilities.

Instead the pulse width (or cycle) of a data strobe signal may be controlled within embodiments of the inventive concept. In certain embodiments, the DQS generator 1110 of the flash memory 1100 may be used to control the cycle of the data strobe signal. That is, the cycle of the data strobe signal may be internally controlled by the flash memory 1100. In certain other embodiments, the cycle of the data strobe signal may be controlled using a read enable signal (nRE) cycle control circuit 1210 provided by the memory controller 1200. Hereafter, certain approaches to the control of a data strobe signal cycle in relation to the control of a read enable signal cycle will be described. As suggested by the embodiment illustrated in FIG. 1, the memory controller 1200 may include an nRE cycle control circuit 1210 configured to control the cycle of the read enable signal.

Figure 4:
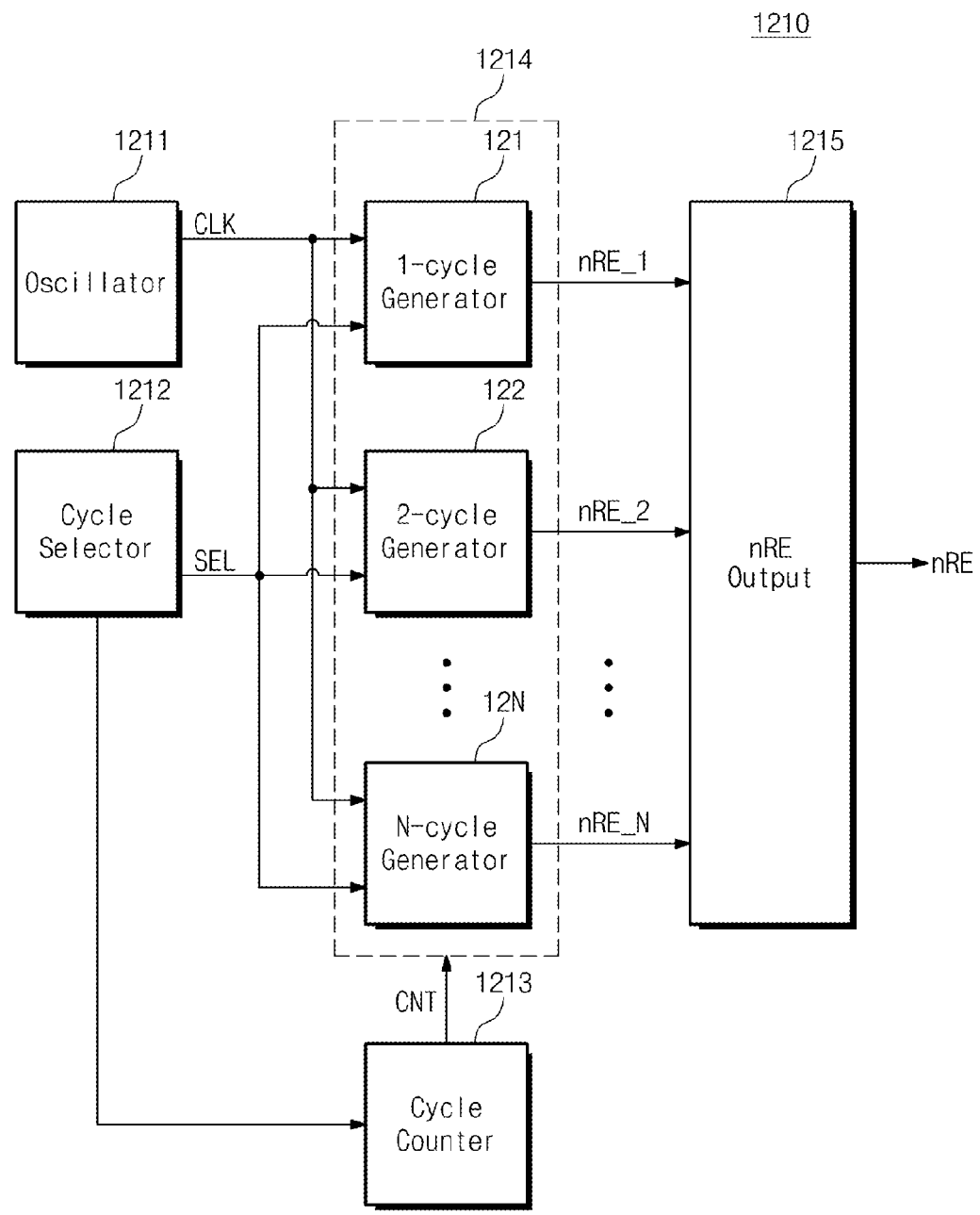
FIG. 4 is a block diagram further illustrating the nRE cycle control circuit 1210 of FIG. 1 according to an embodiment of the inventive concept.

FIG. 4 is a block diagram illustrating one possible example of the nRE cycle control circuit 1210 that might be used in the storage device of FIG. 1 according to certain embodiments of the inventive concept. Referring to FIG. 4, the nRE cycle control circuit 1210 comprises an oscillator 1211, a cycle selector 1212, a cycle counter 1213, a cycle signal generator 1214, and a read enable signal output unit 1215.

The oscillator 1211 may be used to generate a clock signal CLK (hereafter, the reference clock), and the reference clock is provided to the cycle signal generator 1214. The cycle signal generator 1214 may be used to generate a signal having 1 to N-times the cycle of the reference clock. That is, a 1-cycle generator 121 of the cycle signal generator 1214 may be used to generate a signal nRE_1 having the same cycle as the reference clock. (Hereafter, the cycle of the reference clock will be referred to the "reference cycle"). Accordingly, a 2-cycle generator 122 of the cycle signal generator 1214 may be used to generate a signal nRE_2 having a cycle two times (2×) that of the reference cycle. Likewise, an N-cycle generator 12N of the cycle signal generator 1214 may be used to generate a signal nRE_N having a cycle N-times that of the reference cycle. Here, "N" is a natural number greater than 1).

The cycle selector 1212 may be used to operatively select any one of the 1-cycle to N-cycle generators (121 to 12N) (hereafter, "the selected generator") according to a selection signal SEL. The cycle counter 1213 receives certain "selection information" used by the cycle selector 1212 to select the selected generator, generates cycle count information CNT in response to the selection information, and then provides the cycle count information CNT to the selected generator of the cycle signal generator 1214. The read enable signal output unit 1215 receives a signal from the selected generator of the cycle signal generator 1214 and generates a corresponding read enable signal nRE having an appropriately controlled cycle.

Hence, during a set of 'M' initial cycles defining "an initial control period" for the read enable signal nRE, the nRE cycle control circuit 1210 may be used to control the cycle of the read enable signal nRE such that it has a cycle selected from among 1 to N multiples of a reference clock cycle. Here, the value of M may be determined by the cycle count information CNT provided by the cycle counter 1213, and the value of N may be determined by the selection signal SEL provided by the cycle selector 1212.

Figure 5:
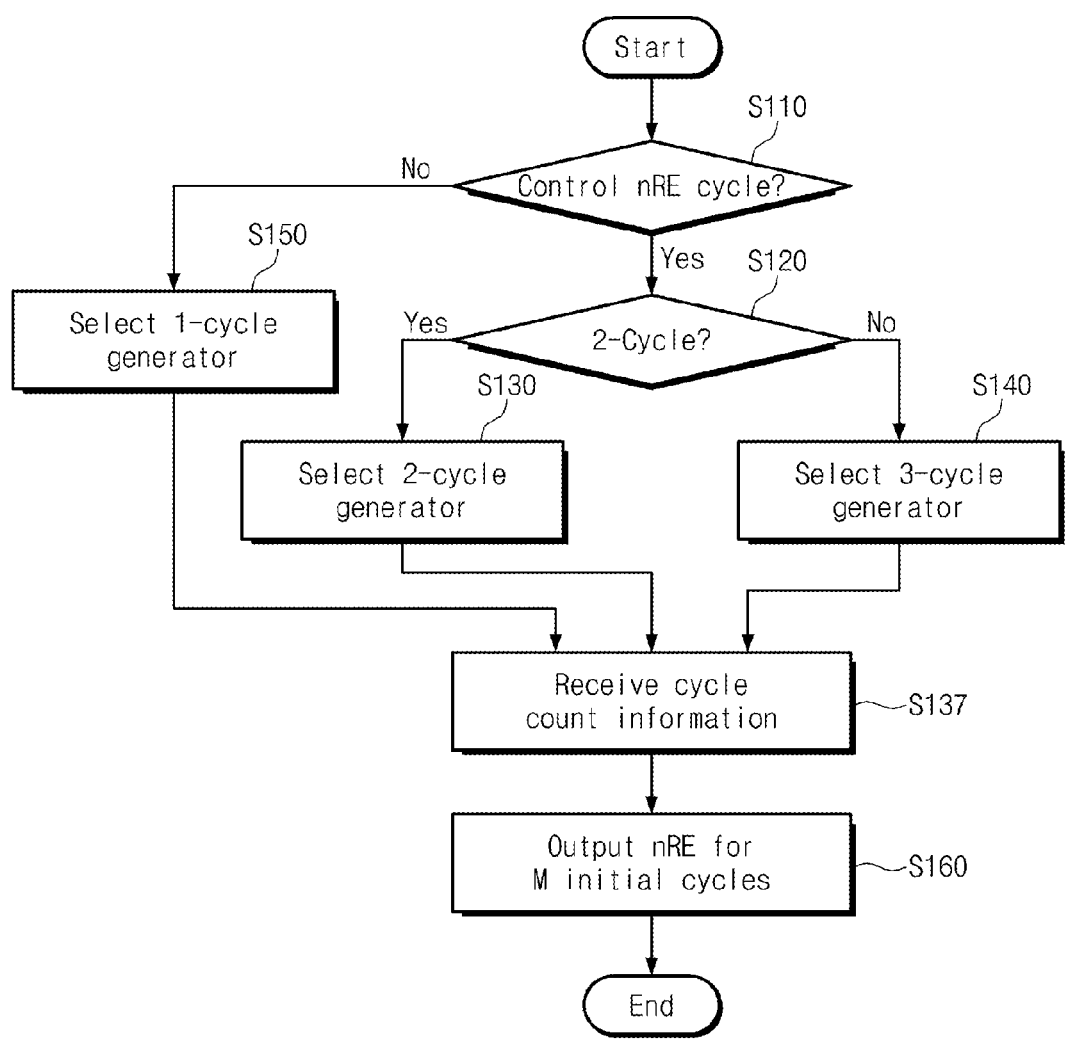
FIG. 5 is a flow chart summarizing in one example a method of operation for the nRE cycle control circuit of FIG. 4 according to an embodiment of the inventive concept.

FIG. 5 is a flow chart summarizing in one example a method of operation for the nRE cycle control circuit 1210 of FIG. 4 according to an embodiment of the inventive concept. In the illustrated example of FIG. 5, the value of 'N' above is assumed to be three (3) in order to eliminate potentially confusing and repetitious detail. That is, the cycle signal generator 1214 is assumed to include only three (3) respective (1, 2, and 3) cycle generators.

In the method of operation, a threshold decision is made as to whether or not control (i.e., selection) should be exercised over the cycle and initial period of the read enable signal nRE (S110). If not (S110=No), a read enable signal nRE having the reference cycle may be generated by selecting operation of the 1-cycle generator 121 using the cycle selector 1212

(S150). This outcome may be understood as a default selection for generation of the read enable signal nRE.

However, if a determination is made that non-default control should be exercised over the cycle and initial control period for the read enable signal nRE (S110=Yes), then the method further determines whether or not the 2-cycle generator 122 should be selected (S120). If yes (S120=Yes), the 2-cycle generator is selected to provide (e.g.,) a read enable signal nRE that has a cycle equal to twice that of the reference cycle (S130). Else, if the 2-cycle generator is not selected (S120=No), then the method selects the 3-cycle generator 123 in order to provide (e.g.,) a read enable signal nRE that has a cycle equal to three times that of the reference cycle (S140).

Once an appropriate cycle for the read enable signal nRE has been selected (e.g., 1×, 2× or 3× that of the reference cycle), the count information derived by the cycle counter 1213 is received and used to define the duration (e.g., M cycles) of the initial control period (S137). Thus, for an appropriate initial control period, the read enable signal having an appropriate cycle may be output (S160).

The foregoing assumptions defining the constituent nature and operation of the nRE cycle control circuit 1210 are clearly exemplarily. Those skilled in the art will recognize that many modifications may be made to the example described in the context of FIGS. 4 and 5.

FIG. 6 is a timing diagram illustrating in one example a method of controlling the cycle of a data strobe signal used by a storage device like the one illustrated in FIG. 1. Here, the storage device 1000 is able to control the cycle of the data strobe signal DQS by controlling the cycle of a read enable signal nRE.

Referring collectively to FIGS. 1, 4 and 6, an nRE cycle control circuit 1210 is assumed to generate a read enable signal nRE_2 having 2× the reference cycle (e.g., 10 ns) during only a first cycle of the read enable signal. Thus, the reference clock cycle is assumed to be 5 ns which means that following the descriptive convention established above N=2 and M=1.

Hence after a second cycle of the read enable signal (e.g., 15 ns, or 10 ns+5 ns) elapses, a first pulse of a data strobe signal DQS is provided to the memory controller 1200. As a result of the foregoing definition of the read enable signal, the first cycle of the data strobe signal will be 2× the reference cycle (e.g., 10 ns) in duration. Of note, the cross-hatched period 'B' shown in FIG. 6 is a period of narrowing for the first high pulse of the data strobe signal analogous to the similarly narrowed period of FIG. 3. However, unlike the outcome described in relation to FIG. 3, the markedly expanded (i.e., 2×) period of the data strobe signal DQS enables the memory controller 1200 to correctly recognize the first pulse of the data strobe signal.

Accordingly, the storage device 1000 of FIG. 1 is able to control the cycle of a read enable signal nRE to thereby control the cycle of a corresponding data strobe signal DQS in order to prevent the occurrence of the abnormal case and the resulting misinterpretation of dummy data verses valid data.

FIGS. 7, 8 and 9 are respective timing diagrams variously illustrating selected definitions for the respective cycles of a read enable signal nRE and a data strobe signal DQS, as well as the duration of an initial control period for same, and the use or non-use of preamble dummy read data bits.

For example, FIG. 7 shows a case, like the case illustrated in FIG. 6, wherein N is equal to 2 and M is equal to 1 in defining the nature of the read enable signal and data strobe signal. Yet no dummy read bits are sent in front of the valid read data. Thus, in FIG. 7 the read enable signal nRE has a cycle of 2× the reference cycle (e.g., 10 ns) and is provided for only an initial one cycle. As the stability of the data strobe signal has been improved, the storage device 1000 need not provide the protective dummy read data bit(s), but instead may process only valid read data.

FIG. 8 shows a case wherein N is still equal to 2, but M has been increase to 2. Thus, the nRE cycle control circuit 1210 will generate the cycle-adjusted read enable signal nRE (e.g., 10 ns) during the first two cycles of an initial control period. Accordingly, the read enable signal nRE is provided for about 15 ns, and the memory controller 1200 receives the corresponding data strobe signal DQS for two initial cycles.

FIG. 9 shows a case wherein N is equal 4 and M is again equal to 1. Hence, the nRE cycle control circuit 1210 generates the read enable signal nRE having a cycle of 4× the reference cycle (e.g., 20 ns) during only an initial cycle forming the initial control period. In response to the read enable signal nRE, the memory controller 1200 receives a data strobe signal having a cycle that is also 4X the reference cycle (e.g., 20 ns) in duration.

Figure 10:
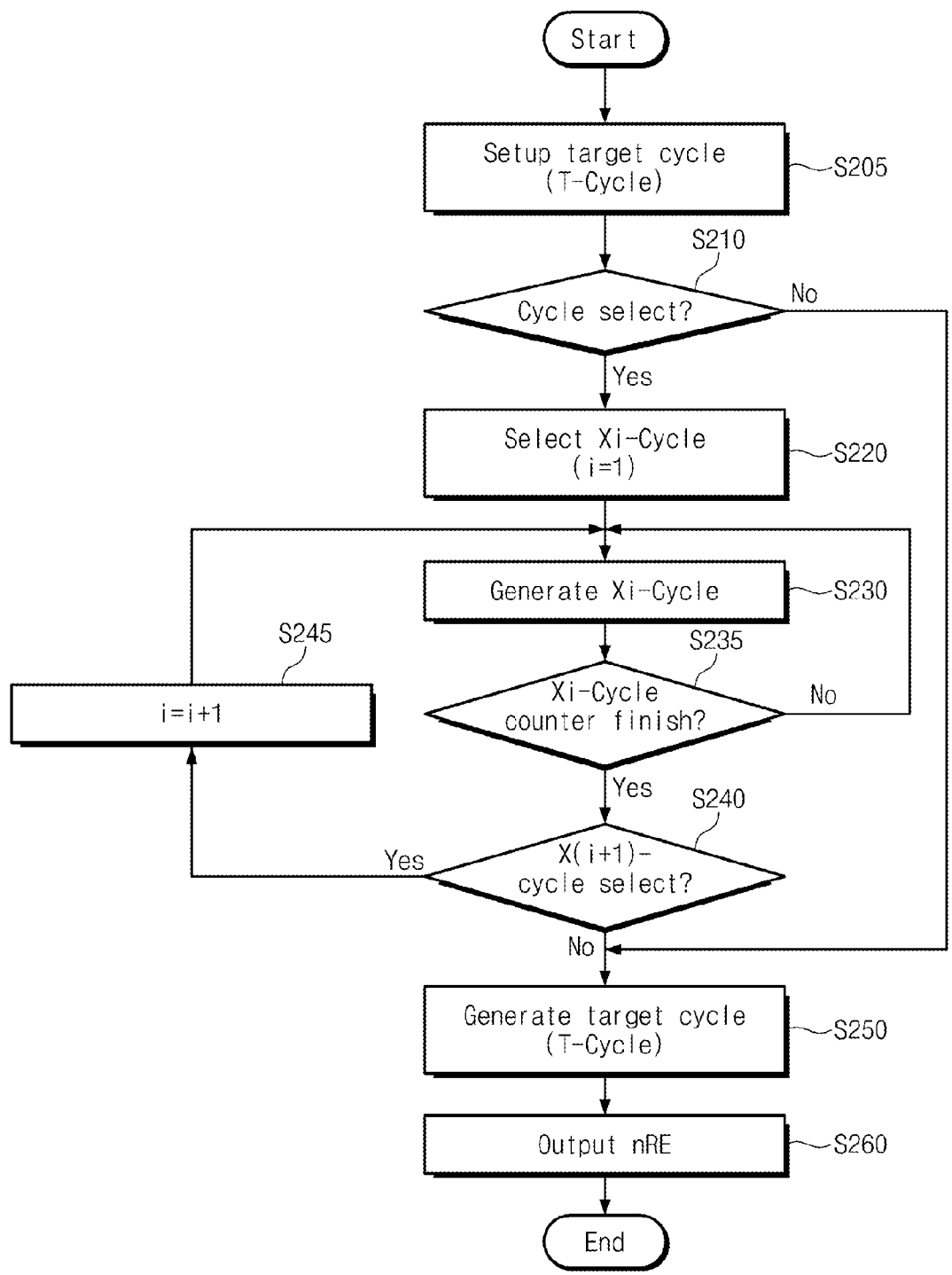
FIG. 10 is a flow chart illustrating in another example a method of operation for the nRE cycle control circuit of FIG. 4 according to another embodiment of the inventive concept.

FIG. 10 is a flow chart summarizing a method of operation for the nRE cycle control circuit 1210 of FIG. 4 according to another embodiment of the inventive concept. An nRE cycle control circuit 1210 shown in FIG. 4 may setup a "target cycle" (T-cycle) that is K-times a reference cycle, where 'K' is a given value (e.g., 1.5 or 3.8 in the context of the embodiments described hereafter in relation to FIG. 11). Alternatively, the nRE cycle control circuit 1210 may exercise cycle control to have different cycles during an initial control period of M cycles (See, hereafter FIG. 12). Methods of operation in which a target cycle is setup as a multiple of the reference cycle, and a number of cycles M defining an initial control period will be more fully described with reference to the flowchart of FIG. 10.

Thus, a target cycle (T-cycle) is setup (S205). The target cycle may be a cycle following a number of cycles forming the initial control period (e.g., initial M cycles). For example, in the embodiments described in relation to FIGS. 6, 7 and 9, the target cycle was setup to have cycle equal to the reference cycle of 5 ns. However, as provided by the method of operation set forth in FIG. 10, a target cycle may be setup to have a cycle having a duration equal to any reasonable multiple of a reference cycle, for example.

Next, a determination is made as to whether or not control should be exercised over the cycle of the read enable signal (S210). As a consequence of determining that the cycle of the read enable signal nRE need not be controlled (S210=No), the cycle selector 1212 may be used to generate a target cycle (S250). For example, assuming a target cycle of 10 ns, the cycle signal generator 1214 may select the 2-cycle generator 122. Thus, the 2-cycle generator 122 may be used to generate a signal nRE_2 having twice the reference cycle.

However, as a consequence of determining that the cycle of the read enable signal nRE should be controlled (S210=Yes), the method of operation may select an X1 cycle (S220). The X1 cycle is a cycle that is controlled during only a first initial cycle, and may have a cycle that is a multiple of the reference cycle. For example, the X1 cycle may be three-times the reference cycle (e.g., 15 ns).

Accordingly, the read enable signal nRE will have a cycle equal to the X1 cycle (S230). For example, when X1 cycle is 15 ns, the cycle signal generator 1214 may select a 3-cycle generator 123, wherein the 3-cycle generator 123 may be used to generate the read enable signal nRE_3 having a cycle three-times that of the reference cycle.

Then, the cycle counter 1213 in response to selection information received from the cycle selector 1212 and may provide cycle count information CNT to an X1-cycle generator (S235). Here, the X1-cycle generator may be one of 1-cycle to N-cycle generators 121 to 12N. The X1-cycle generator may be used to generate an X1-cycle read enable signal nRE_X1 according to the cycle count information CNT.

Once the defined read enable signal nRE is generated according to the cycle count information CNT (S235=Yes), a next determination is made as to whether to select an X2 cycle (S240). If yes (S240=Yes), the method of operation increments the control parameter 'i' by 1. Afterwards, the method returns to S230 in which the X2 cycle may be generated. That is, the cycle selector 1212 may select an X2-cycle generator, etc., and the X2-cycle generator may be used to generate a read enable signal nRE_X2 having X2-times the cycle according to the cycle count information CNT. In this manner an nRE cycle signal generator 1210 may be used to generate a signal having different cycles during initial M cycles through iteration of method steps S230 through S245.

However, returning to step S240, if an X(i+1) cycle is not selected, the method generates the defined target cycle (T-cycle) (S250) and outputs the corresponding read enable signal nRE (S260).

Figure 11:
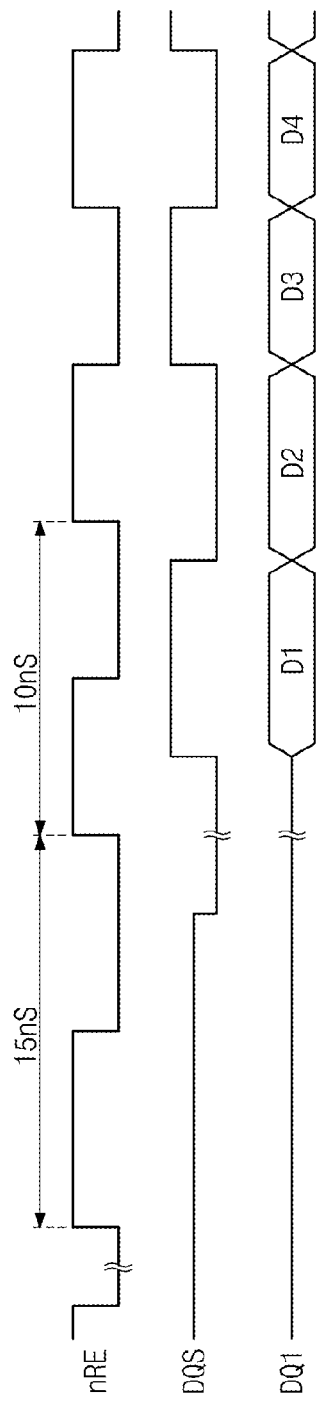
FIG. 11 is a timing diagram illustrating an embodiment in which a target cycle of a read enable signal nRE is set up to have twice a reference cycle.

FIG. 11 is a timing diagram showing an example wherein a target cycle for a read enable signal nRE is setup to have a cycle that is 2× a reference cycle. In FIG. 11, a reference cycle is again assumed to be 5 ns, while the desired target cycle is 10 ns. Referring to FIG. 11, the read enable signal nRE may be generated having a cycle of 3× the reference cycle (e.g., 15 ns) during an initial one cycle, and a cycle of 2× during the target cycle (e.g., 10 ns). That is, in FIG. 11, an X1 cycle may be three-times the reference cycle, and a target cycle may be twice the reference cycle. During a first cycle the corresponding data strobe signal DQS will have a cycle equal to 3× the reference cycle.

Figure 12:
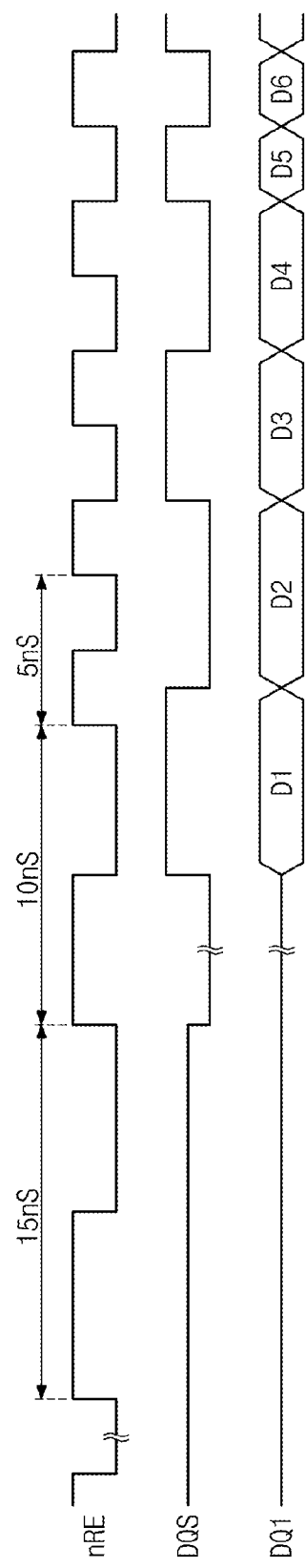
FIG. 12 is a timing diagram illustrating an embodiment in which a signal has different cycles during an initial M cycles of a read enable signal nRE.

FIG. 12 is a timing diagram showing an embodiment wherein a read enable signal has different cycles during respective cycles of an initial control period (M=3). In FIG. 12, a reference cycle and target cycle are both assumed to be 5 ns. A first cycle of the initial control period is assumed to have a cycle 3X a reference cycle (e.g., 15 ns), a second cycle of the initial control period is assumed to have a cycle 2X the reference cycle (e.g., 10 ns), and the target cycle following the initial control period is 5 ns. Thus, the design and definition of the initial control period, its constituent cycles, as well as a target period—all in relation to a reference cycle—may be accurately controlled by methods consistent with embodiments of the inventive concept.

Hence, if during a first cycle the data strobe signal is 3× the reference cycle, and during a second cycle it is 2× the reference cycle, the first pulse of the data strobe signal DQS may not be misinterpreted by the memory controller 1200 no matter resistance issues related to the data strobe signal line.

Figure 13:
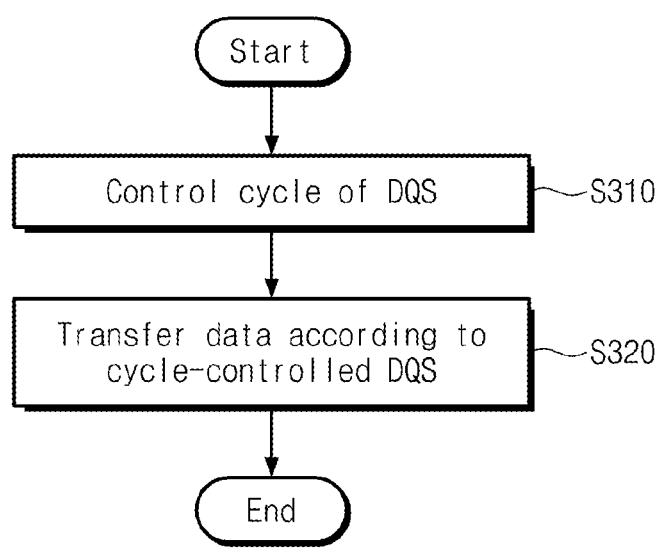
FIG. 13 is a flow chart summarizing in one example a method of operation for a storage device according to an embodiment of the inventive concept.

FIG. 13 is a flow chart illustrating in one example a method of operation for a storage device according to an embodiment of the inventive concept. Referring to FIGS. 1 and 13, the method of operation for the storage device 1000 comprises controlling the cycle of a data strobe signal DQS (S310), and transferring read data via a plurality of data lines in response to the cycle-controlled data strobe signal (S320). As before, the data strobe signal may be controlled in relation to a reference cycle and may be differently controlled over an initial control period of M cycles.

The method of operation illustrated in FIG. 13 may be used to directly control the cycle of the data strobe signal using the DQS generator 1110 that is disposed in the flash memory 1100. In this case, the cycle of the data strobe signal may be controlled according to a cycle-controlled read enable signal nRE provided from the memory controller 1200, or according to some other reference clock-like signal (i.e., a signal having stable period) that is internally generated by the flash memory 1100.

Figure 14:
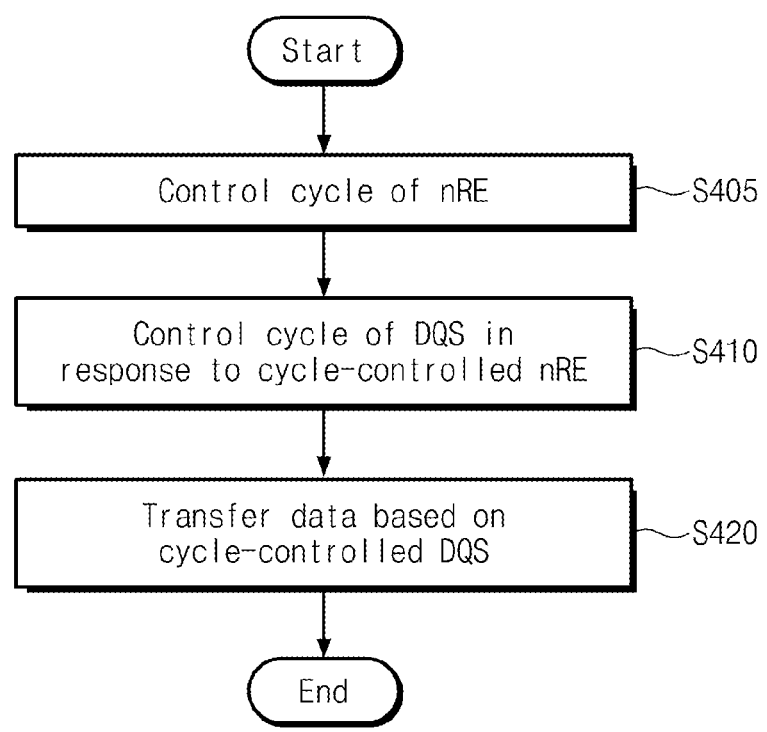
FIG. 14 is a flow chart summarizing in one example a method of operation for a storage device according to another embodiment of the inventive concept.

FIG. 14 is a flow chart summarizing a method of operation for a storage device according to another embodiment of the inventive concept. Referring again to FIGS. 1 and 14, the method of operation for the storage device 1000 comprises the steps of controlling the cycle of a read enable signal nRE that is generated in response to a read request (S405); controlling the cycle of a data strobe signal DQS in relation to the cycle-controlled read enable signal nRE (S410); and transferring read data via a plurality of data lines in response to the cycle-controlled data strobe signal DQS. Here again, one or both of the read enable signal nRE and data strobe signal DQS may be controlled to have a cycle that is N-times a reference cycle during an initial control period of M cycles.

The method of operation illustrated in FIG. 14 may control the cycle of the read enable signal nRE using the nRE cycle signal generator 1210 that is disposed in the memory controller 1200. In this case, the cycle of the data strobe signal DQS will be indirectly controlled in relation to the cycle-controlled read enable signal provided from the memory controller 1200. For each of the illustrated embodiments described above, a method of operation for a flash based data storage device according to the inventive concept avoids the problems of missing or misinterpreting a first pulse of the data strobe signal DQS provided from the flash memory to a corresponding memory controller. As a result, valid data communicated from the flash data storage device is not missed, or erroneously interpreted to be dummy data by the memory controller.

The foregoing embodiments have been drawn to exemplary methods and data storage devices that execute a read operation that transfers read data from a flash based data storage device to a corresponding memory controller. However, a severely attenuated first pulse width for a data strobe signal DQS may have equally adverse effects on methods and data storage devices executing a write operation. That is, a flash memory based storage device according to certain embodiments of the inventive concept may stably transfer write data from a constituent memory controller to a flash memory when the width of a first pulse of the data strobe signal DSQ is narrowed during execution of a write operation.

Figure 15:
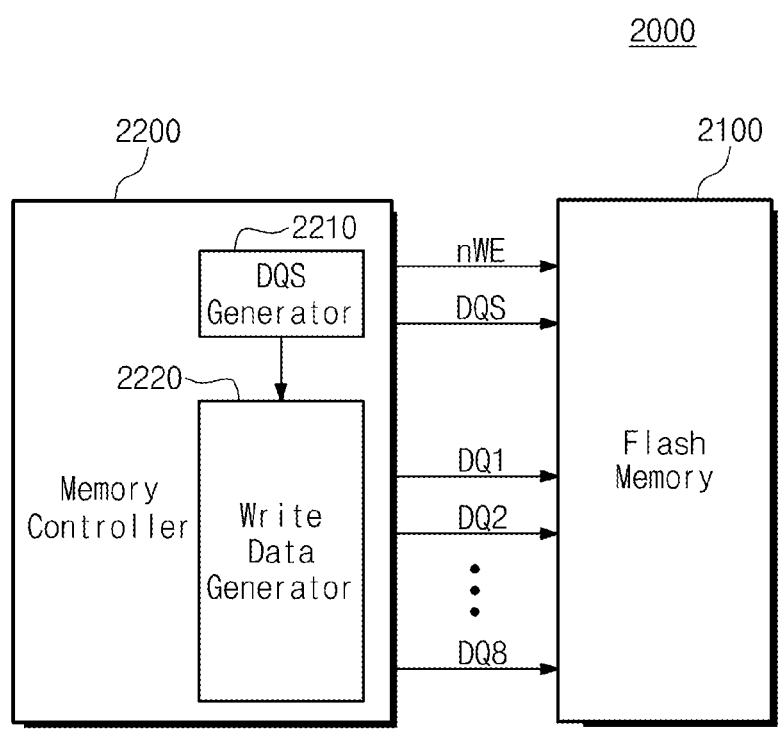
FIG. 15 is a block diagram illustrating a storage device 2000 that is capable of executing a write operation according to certain embodiments of the inventive concept.

FIG. 15 is a block diagram illustrating execution of a write operation by a storage device 2000 according to an embodiment of the inventive concept. The storage system 2000 is highly analogous to the storage device 1000 previously described in relation to FIG. 1, and generally comprises a flash memory 2100 and a memory controller 2200.

Referring to FIG. 15, the memory controller 2200 is now assumed to receive a "write request" from an external device, along with associated "write data" (i.e., data to be programmed to the flash memory 2100). Upon receiving the write request, the memory controller 2200 provides a corresponding "write enable signal" (nWE) to the flash memory 2100. A DQS generator 2210 of the memory controller 2200 may be used to generate a data strobe signal (DQS), wherein consistent with the dictates of the inventive concept the data strobe signal is cycle-controlled. Thus, a cycled-controlled data strobe signal is provided to the flash memory 2100 as part of the write operation.

Upon receiving the cycle-controlled data strobe signal DQS from the memory controller 2200, the flash memory 2100 prepares to receive the write data being transferred from a write data generator 2220 of the memory controller 2200. In certain embodiments of the inventive concept, the write data is provided by the write data generator 2220 of the memory controller 2200 to the flash memory 2100 synchronously with a center point of the cycle-controller data strobe signal DQS (e.g., using a center-aligned signal transmission approach). In FIG. 15, 8-bit write data is assumed to be provided from the write data generator 2220 to the flash memory 2100 on each transition of the data strobe signal DQS.

Figure 16:
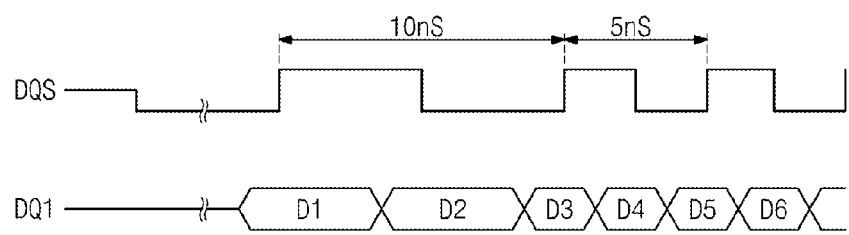
FIGS. 16, 17 and 18 are respective timing diagrams further illustrating embodiments in which the cycle of a data strobe signal DQS is controlled within the storage device 2000 of FIG. 15.
Figure 17:
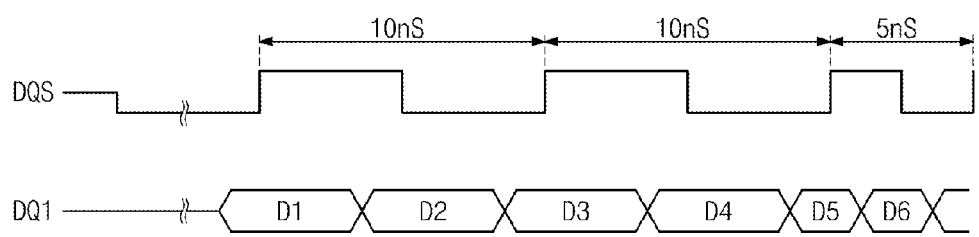
Figure 18:
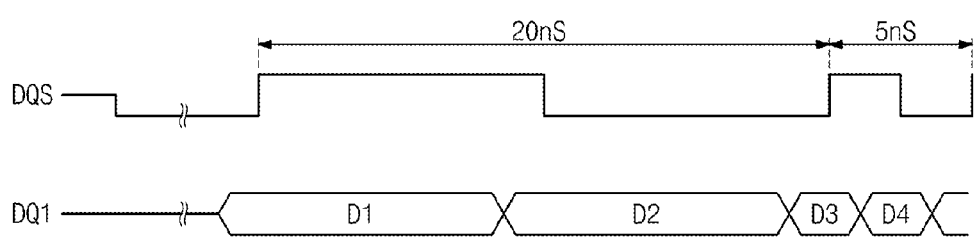

FIGS. 16, 17 and 18 are respective timing diagrams illustrating examples in which the cycle of the data strobe signal DQS described in conjunction with the data storage device 2000 of FIG. 15 is controlled according to principles of the inventive concept previously described. Thus, the cycle of the data strobe signal DQS may be controlled in a manner similar to those described with reference to FIGS. 4 and 5.

FIG. 16 shows a data strobe signal DQS having a cycle that is controlled to be twice that of a reference cycle. Here as before, the reference cycle is assumed to be 5 ns, and hence the cycle-controlled version (e.g., N=2) of the data strobe signal DQS is 10 ns in FIG. 16. In the example of FIG. 16, the cycle-controlled data strobe signal DQS is provided for an initial control period of 1 cycle (i.e., following the descriptive convention established above, M=1). A target cycle (here, the $2^{nd}$ cycle) for the data strobe signal DQS follows the initial control period. From the target cycle onward, the cycle of the data strobe signal DQS is assumed to be the reference cycle (e.g., 5 ns).

FIG. 17 shows a cycle-controlled data strobe signal DQS having a cycle that is twice the reference cycle (e.g., 10 ns). However, the initial control period is set to be two cycles (M=2).

FIG. 18 shows a cycle-controlled data strobe signal DQS having a cycle that is 4× that of the reference cycle (e.g., 20 ns).

Upon referring to FIGS. 16, 17 and 18 those of ordinary skill in the art will recognize that each approach at least doubles the effective width of a first pulse of the data strobe signal DQS. This prevents the problems described above wherein the duty rate of the data strobe signal DQS is disturbed when write data is first transferred from the memory controller to flash memory.

Various storage devices according to embodiments of the inventive concept are applicable to, or may be incorporated within, a great variety of products. Storage devices according to various embodiments of the inventive concept may be applied to a memory card, an USB memory, and/or a solid state drive (SSD). Storage devices according to various embodiments of the inventive concept may be incorporated within a personal computer, digital camera, camcorder, cellular phone, MP3 player, PMP, PSP, PDA, etc.

Figure 19:
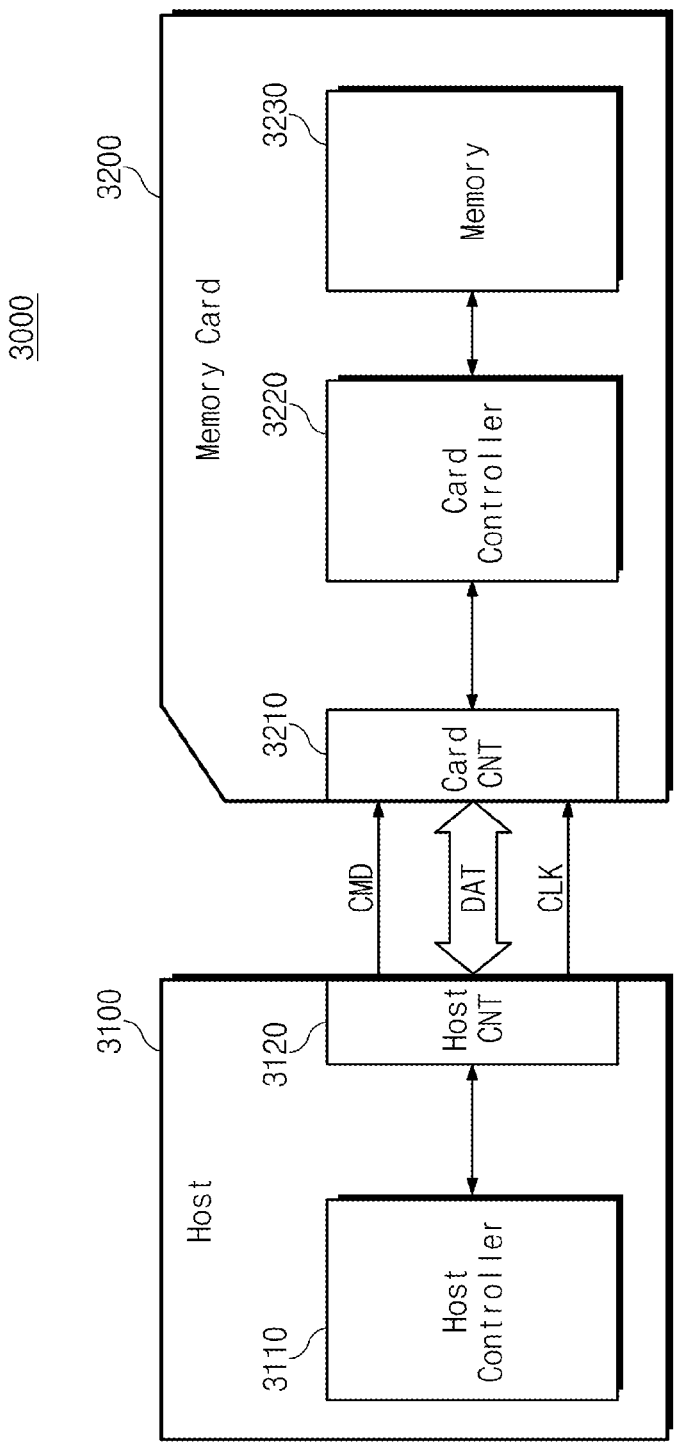
FIG. 19 is a block diagram illustrating a memory card system to which a storage device according to an embodiment of the inventive concept may be applied.

FIG. 19 is a block diagram illustrating a memory card system to which a storage device according to an embodiment of the inventive concept may be applied. Referring to FIG. 19, a memory card system 3000 may include a host 3100 and a memory card 3200. The host 3100 may include a host controller 3110 and a host connection unit 3120. The memory card 3200 may include a card connection unit 3210, a card controller 3220, and a flash memory 3230.

The host 3100 may be configured to write data in the memory card 3200 or to read data stored in the memory card 3200. The host controller 3110 may send a command (e.g., a write command), a clock signal CLK generated within a clock generator (not shown) of the host 3100, and data to the memory card 3200 via the host connection unit 3120.

The card controller 3220 may operate in response to a write command received via the card connection unit 3210, and may store data in the memory 3230 in synchronization with a clock signal generated by a clock generator (not shown) of the card controller 3220. The flash memory 3230 may store data transferred from the host 3100. For example, if the host 3100 is a digital camera, the flash memory 3230 may store image data.

The card controller 3220 may control the duration of the initial control period (e.g., a defined set of M cycles) during which a cycle-controlled data strobe signal DQS is provided via a data strobe line from the flash memory 3230. During a read operation, the card controller 3220 may provide the flash memory 3230 with a read enable signal nRE, and the flash memory 3230 may receive the read enable signal nRE to control the duration of the initial control period (M cycles) of the cycle-controlled data strobe signal DQS provided via the data strobe line from the card controller 3220. The card controller 3220 may control the read enable signal nRE to have a cycle that is N-times a reference cycle.

Figure 20:
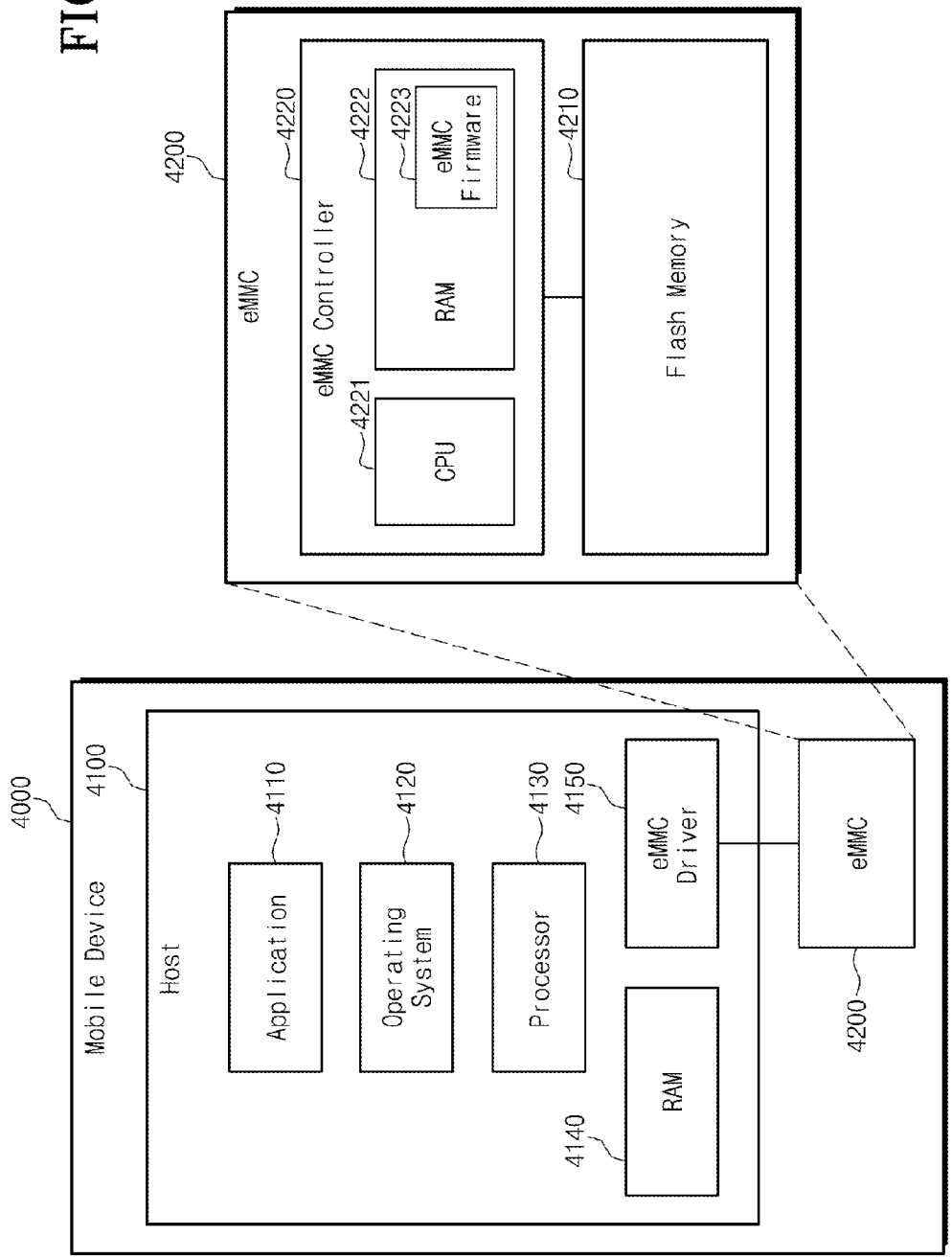
FIG. 20 is a block diagram illustrating a mobile device to which a storage device according to an embodiment of the inventive concept may be applied.

FIG. 20 is a block diagram illustrating a mobile device to which a storage device according to an embodiment of the inventive concept may be applied. Referring to FIG. 20, a mobile device 4000 may include a host 4100 and an embedded storage device 4200. In FIG. 20, the embedded storage device 4200 may be an embedded MMC (eMMC). The eMMC 4200 may be a memory card complying with the JEDEC standards, and may be formed to be embedded in the mobile device 4000.

The host 4100 may include an application 4110, an operating system 4120, a processor 4130, a random access memory (RAM) 4140, and an eMMC driver 4150. The eMMC 4200 may include a flash memory 4210 and an eMMC controller 4220. The eMMC controller 4220 may include a central processing unit (CPU) 4221 and a random access memory (RAM) 4222. The CPU 4221 may drive eMMC firmware 4223 using the random access memory 4222.

The eMMC controller 4220 may be used to control the duration of the initial control period (M cycles) during which a cycle-controlled data strobe signal DQS is provided via a data strobe line from the flash memory 4210. During a read operation, the eMMC controller 4220 may provide the flash memory 4210 with a read enable signal nRE, and the flash memory 4210 upon receiving the read enable signal nRE will operate in response to the initial control period (M cycles) and the cycle-controlled data strobe signal DQS provided via the data strobe line from the eMMC controller 4220. Here, the eMMC controller 4220 may be used to control the read enable signal nRE to have a cycle that is N-times a reference cycle.

Figure 21:
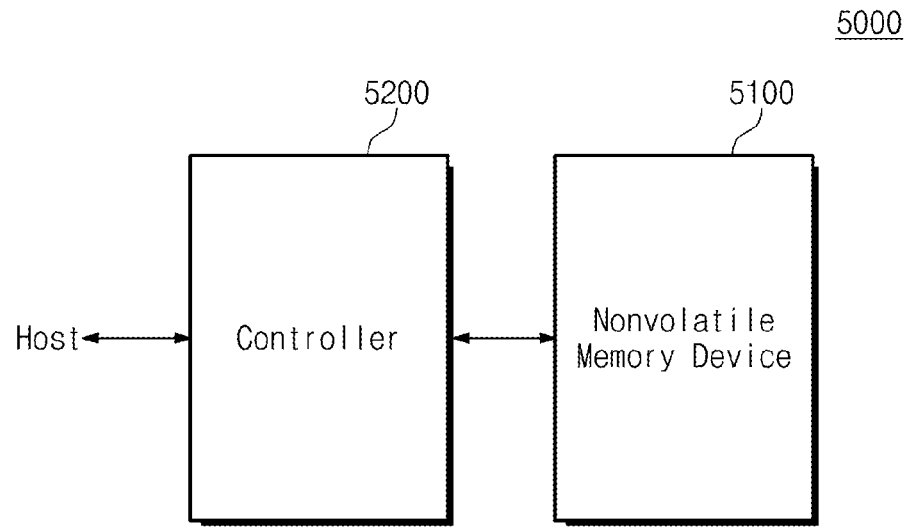
FIG. 21 is a general block diagram illustrating a storage device according to an embodiment of the inventive concept.
Figure 22:
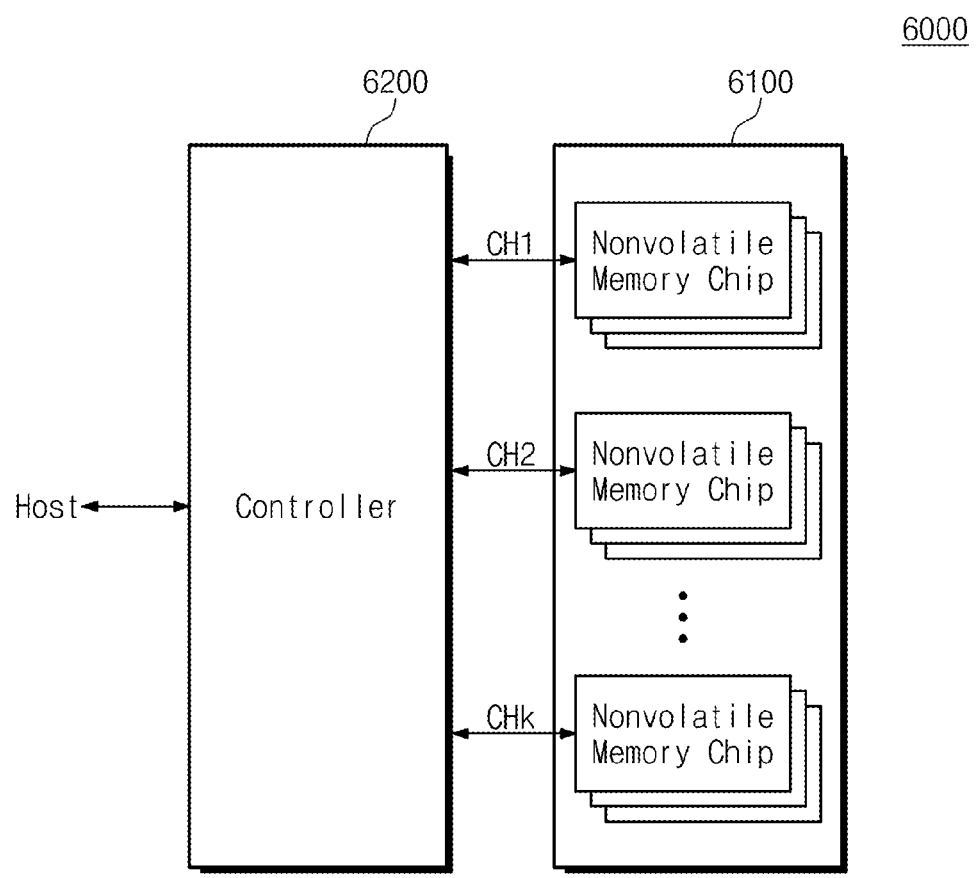
FIG. 22 is a block diagram illustrating one possible application for the storage device shown of FIG. 21.
Figure 23:
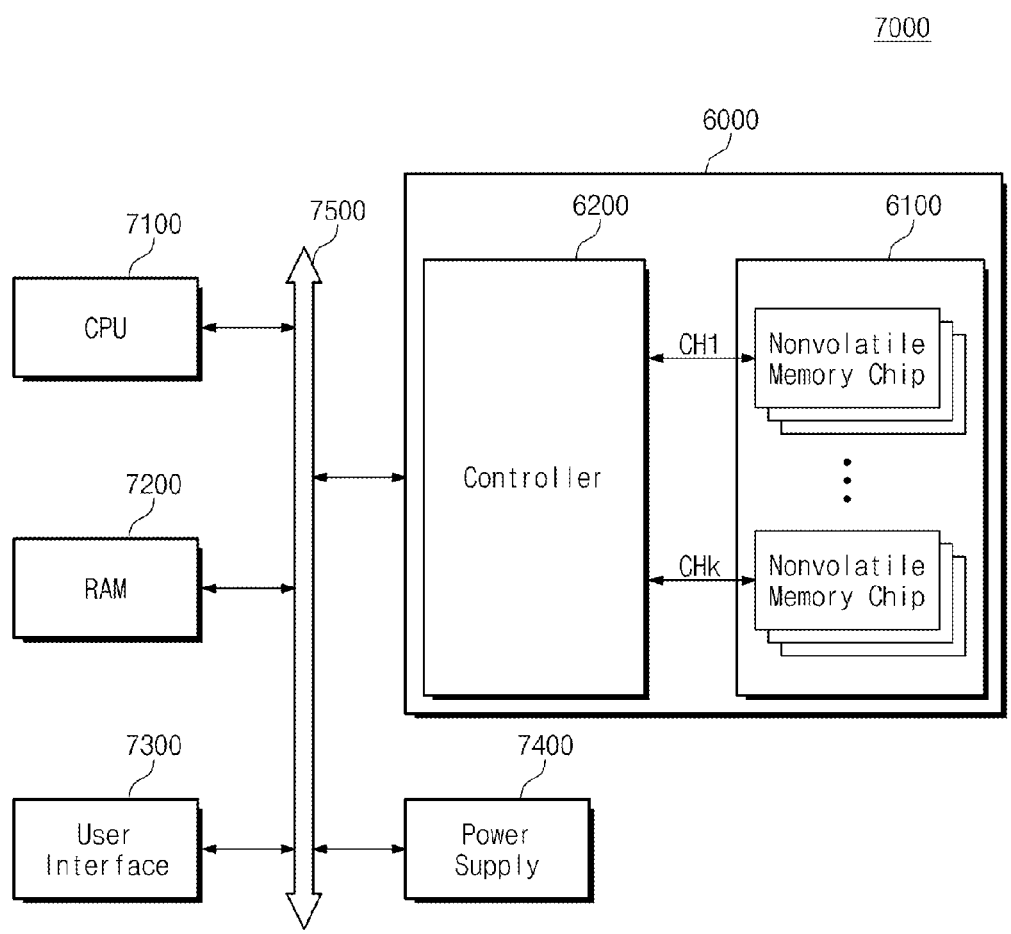
FIG. 23 is a block diagram illustrating a computing system including the storage device described with reference to FIG. 22.

FIG. 21 is a block diagram schematically illustrating a storage device according to an embodiment of the inventive concept. FIG. 22 is a block diagram schematically illustrating an application of a storage device shown in FIG. 21. FIG. 23 is a block diagram schematically illustrating a computing system including a storage device described with reference to FIG. 22.

Referring to FIG. 21, a storage device 5000 generally comprising a nonvolatile memory device 5100 and a controller 5200. The controller 5200 and nonvolatile memory device 5100 may be integrated in a single semiconductor device to form a solid state drive (SSD). In the event that the storage device 5000 is used as the solid state driver SSD, it is possible to remarkably improve an operating speed of an external device (i.e., a host) connected to the storage device 5000.

The controller 5200 may be connected to the host and the nonvolatile memory device 5100. In response to a read/write request from the host, the controller 5200 may be configured to access the nonvolatile memory device 5100. For example, the controller 5200 may be configured to control a read operation, a write operation, an erase operation, and a background operation of the nonvolatile memory device 5100. The controller 5200 may be configured to provide an interface between the nonvolatile memory device 5100 and the host. The controller 5200 may be configured to drive firmware for controlling the nonvolatile memory device 5100.

Referring to FIG. 22, a storage device 6000 may include a nonvolatile memory device 6100 and a controller 6200. The nonvolatile memory device 6100 may include a plurality of nonvolatile memory chips. The plurality of nonvolatile memory chips may be divided into a plurality of groups. Nonvolatile memory chips in each group may be configured to communicate with the controller 6200 through a common channel. For example, there is illustrated an embodiment in which a plurality of nonvolatile memory chips communicates with the controller 6200 through channels CH1 to CHk. In FIG. 22, there is illustrated an embodiment in which a plurality of nonvolatile memory chips is connected to a channel. It is understood that the storage device 6000 is changed such that a nonvolatile memory chip is connected to a channel.

Referring to FIG. 23, a computing system 7000 may include a central processing unit (CPU) 7100, a RAM 7200, a user interface 7300, a power supply 7400, and a storage device 6000.

The storage device 6000 may be electrically connected to the CPU 7100, the RAM 7200, the user interface 7300, and the power supply 7400 through a system bus 7500. Data to be provided through the user interface 7300 or being processed by the CPU 7100 may be stored in the storage device 6000.

In FIG. 23, there is illustrated an embodiment in which the nonvolatile memory device 6100 is connected to the system bus 7500 through the controller 6200. However, the nonvolatile memory device 6100 may be directly connected to the system bus 7500. In FIG. 23, the storage device 6000 may be a storage device described with reference to FIG. 22. However, the storage device 6000 may be replaced with a storage device 5000 described with reference to FIG. 21. Also, the computing system 7000 may be configured to include all of storage devices 5000 and 6000 described with reference to FIGS. 21 and 22.

While the inventive concept has been described with reference to exemplary embodiments, it will be apparent to those skilled in the art that various changes and modifications may be made without departing from the scope of the following claims.

What is claimed is:

1. A storage device comprising:
   a memory controller connected via a data strobe line and a plurality of data lines to a flash memory and comprising a read enable signal (nRE) cycle control circuit;
   the flash memory being configured during a read operation to provide read data to the memory controller and comprising a data strobe generator,
   wherein during the read operation, the nRE cycle control circuit provides a cycle-controlled read enable signal to the flash memory during an initial control period,
   the flash memory, upon receiving the cycle-controlled read enable signal, uses the data strobe generator to generate a cycle-controlled data strobe signal having a cycle that correspond to a cycle of the cycle-controlled read enable signal and provides the cycle-controlled data strobe signal to the memory controller, such that the read data is transferred from the flash memory to the memory controller synchronously with the cycle-controlled data strobe signal.

2. The storage device of claim 1, wherein the data strobe generator generates and provides the cycle-controlled data strobe signal for a period equal to the initial control period.

3. The storage device of claim 2, where the nRE cycle control circuit is configured to define the duration of the initial control period as M cycles of the cycle-controlled read enable signal, and to define the cycle of the cycle-controlled read enable signal to be N-times that of a reference cycle, 'M' and 'N' being respective natural numbers.

4. The storage device of claim 3, wherein following the initial control period, the nRE cycle control circuit is further configured to provide the read enable signal having the reference cycle.

5. The storage device of claim 3, wherein for each one of the M cycles of the initial control duration N is different.

6. The storage device of claim 3, wherein the nRE cycle control circuit comprises:
   a cycle selector configured to operatively select a cycle generator from among a number of cycle generators;
   a cycle counter configured to provide count information; and
   a cycle signal generator configured to generate the cycle-controlled read enable signal in response to count information and the selected one of the cycle generators.

7. The storage device of claim 1, wherein the memory controller receives the read data via the plurality of data lines from the flash memory on at least one of a rising edge and a falling edge of the cycle-controlled data strobe signal.

8. The storage device of claim 7, wherein the memory controller further comprises a first-in/first-out circuit configured to sequentially latch the read data received from the flash memory.

9. The storage device of claim 7, wherein the memory controller interprets at least one read data bit initially received from the flash memory as dummy data.

10. The storage device of claim 7, wherein the memory controller interprets each and every read data bit received from the flash memory as valid data.

* * * * *